(12) United States Patent
Han et al.

(10) Patent No.: US 6,777,311 B2
(45) Date of Patent: Aug. 17, 2004

(54) THICK WAFER PROCESSING AND RESULTANT PRODUCTS

(75) Inventors: Hongtao Han, Mooresville, NC (US); Jay Mathews, Huntersville, NC (US)

(73) Assignee: Digital Optics Corp., Charlotte, NC (US)

(*) Notice: Subject to any disclaimer, the term of this patent is extended or adjusted under 35 U.S.C. 154(b) by 0 days.

(21) Appl. No.: 10/087,989

(22) Filed: Mar. 5, 2002

(65) Prior Publication Data

US 2002/0126941 A1 Sep. 12, 2002

Related U.S. Application Data

(63) Continuation-in-part of application No. 09/983,278, filed on Oct. 23, 2001.
(60) Provisional application No. 60/273,321, filed on Mar. 6, 2001.

(51) Int. Cl.[7] .............................................. H01L 21/301
(52) U.S. Cl. ........................................ 438/462; 438/113
(58) Field of Search ..................... 438/42, 113, 401, 438/460, 462

(56) References Cited

U.S. PATENT DOCUMENTS

| | | | |
|---|---|---|---|
| 5,369,060 A | | 11/1994 | Baumann |
| 5,739,048 A | * | 4/1998 | Kerth et al. ............... 216/22 |
| 5,888,883 A | | 3/1999 | Sasaki et al. |
| 6,107,164 A | | 8/2000 | Ohuchi |
| 6,271,102 B1 | | 8/2001 | Brouillette |

* cited by examiner

Primary Examiner—David Nelms
Assistant Examiner—David Vu
(74) Attorney, Agent, or Firm—Susan S. Morse

(57) ABSTRACT

A thick wafer is diced by partially dicing a first side to form a first dice, flipping the wafer so that the first side is now in contact with a dicing tape, and dicing a second side. The dicing of the second side may be achieved by aligning a dicing tool to the first dice and/or alignment marks on the wafer. The thick wafer may be a composite wafer including two or more wafers bonded together. These two wafers may be different thicknesses and/or different materials.

20 Claims, 2 Drawing Sheets

THICK WAFER PROCESSING AND RESULTANT PRODUCTS

This application is a continuation-in-part of prior application Ser. No. 09/983,278, filed Oct. 23, 2001 and claims the benefit of provisional application No. 60/273,321 filed Mar. 6, 2001.

BACKGROUND OF THE INVENTION

1. Field of the Invention

The present invention is directed to a method of processing thick wafers and the resultant products, more particularly to lithographic processing and separating of thick wafers.

2. Description of Related Art

Automated semiconductor processing equipment has been designed for wafer thicknesses generally on the order of 0.5 mm–1.5 mm. Some classes of semiconductor processing equipment are even more limited. The chucks used to support the wafers in the stepper are of a fixed thickness. The chucks could be thinned to accommodate thicker wafers, but this results in a less rigid chuck and could compromise performance. Also, the chucks may only be thinned so far.

When thick wafers, i.e., those having thicknesses not accommodated by current processing equipment, e.g., on the order of 2 mm or thicker, are to be processed, the automated semiconductor processing equipment could be redesigned to allow such processing. However, this redesign will most likely compromise current performance and/or require significant tool modifications. Further, each time a greater thickness is desired, further redesign would be required.

Even once thick wafers have the desired features formed thereon, there are other problems in vertically separating the thick wafers to produce the individual parts. This separation is required to realize the mass production advantages offered by wafer level processing.

SUMMARY OF THE PRESENT INVENTION

The present invention is therefore directed to a method of processing thick wafers, including separating them into individual components, and the resultant structures which substantially overcomes one or more of the problems due to the limitations and disadvantages of the related art.

At least one of the above and other objects may be realized by providing a method of vertically separating a thick wafer having a top surface and a bottom surface, the thick wafer being on a dice support. The method includes aligning a first dicing tool for a first dice with the thick wafer adjacent to the top surface, dicing the thick wafer to create a first dice, flipping the thick wafer so that the top surface is in contact with the dice support, aligning a second dicing tool for a second dice with the composite wafer adjacent to the bottom surface of the thick wafer, and dicing through the thick wafer.

The first and second dicing tools may be the same. After dicing to create the first dice, another wafer may be bonded on top of the first dice. After dicing to create the first dice, a third dicing tool for a third dice may be aligned with the thick wafer adjacent to the another wafer and dicing to create a third dice. The third dice may be created before the second dice. At least two of the first, second and third dicing tools are the same. The aligning may include aligning the second dicing tool through the thick wafer to the first dice an/or to alignment marks on the thick wafer. Alignment marks on the top and bottom surfaces of the thick wafer may be formed prior to aligning the first dicing tool.

The thick wafer may include a first wafer and a second wafer, and these may have different thicknesses and/or be of different materials. At least one of the first and second wafers may be lithographically processed on a wafer level. At least one of the first and second wafers may have a lithographically created optical element thereon. The first and second wafers may be bonded together before aligning of the first dicing tool. The bonding may include providing adhesive material between the first and second wafers, fusing the first and second wafers together, and provide metal pads between the first and second wafers. Before the bonding, at least one of the first and second wafers may be lithographically processed, which may include creating an optical element.

These and other objects of the present invention will become more readily apparent from the detailed description given hereinafter. However, it should be understood that the detailed description and specific examples, while indicating the preferred embodiments of the invention, are given by way of illustration only, since various changes and modifications within the spirit and scope of the invention will become apparent to those skilled in the art from this detailed description.

BRIEF DESCRIPTION OF THE DRAWINGS

The foregoing and other objects, aspects and advantages will be described with reference to the drawings, in which.

DETAILED DESCRIPTION

Figure 1:
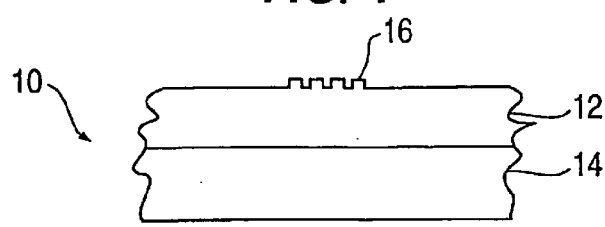
FIG. 1 is a schematic cross-sectional view of a thick wafer with lithographic processing on an outer surface in accordance with the present invention.

The present invention will be described in detail through preferred embodiments with reference to accompanying drawings. However, the present invention is not limited to the following embodiments but may be implemented in various types. The preferred embodiments are only provided to make the disclosure of the invention complete and make one having an ordinary skill in the art know the scope of the invention. The thicknesses of various layers and regions are emphasized for clarity in accompanying drawings. Also, when a layer is defined to exist on another layer or a substrate, the layer may exist directly on another layer or substrate, or an interlayer layer may be present there between. Throughout the drawings, the same reference numerals denote the same elements.

A need for the ability to process thicker wafers is driven by the increasing complexity of optical subsystems, requiring more vertically integrated optical elements. This need is also driven by specific optical designs, in which it is desirable to have light traveling through a certain amount of material having an index higher than air. For example, if a certain degree of separation is desired between optical beams in the subsystem, the further these beams travel, the larger the separation. Finally, this need is driven by the demand for ease in handling and inserting optical subsystems into larger systems.

FIG. 1 illustrates a thick composite wafer 10 formed by bonding two thinner wafers 12, 14. Here, a diffractive optical element 16 has been formed on wafer 12. If either of the individual wafers 12, 14 are to be lithographically processed they may have a thickness well within the operational thicknesses of the processing equipment so that no modifications to the equipment are needed. The wafers may be of the same or different materials, and may be of the same or different thicknesses. Any one or all of the wafers making up the thick composite wafer may be lithographically processed. Wafers that are not to be lithographically processed may be of any desired thickness. The wafers may serve as spacer wafers, with no features thereon, but just used to attain the desired thickness of the subsystem.

This bonding may include, for example, glass fusion, adhesive bonding, anodic bonding, solder bonding and metallic bonding. The type of bonding used will depend on the materials of the wafers and the intended end use. The bonding will also need to be able to withstand the vertical separation needed to form individual optical components. Of course, more than two wafers may be bonded together.

Figure 2:
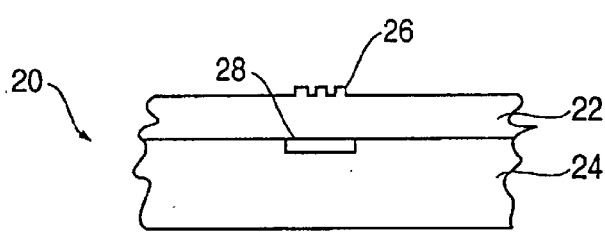
FIG. 2 is a schematic cross-sectional view of a thick wafer with lithographic processing on both an inner and an outer surface in accordance with the present invention.

FIG. 2 is another example of a thick wafer 20 formed by bonding two thinner wafers 22, 24. Here, both wafers 22, 24 have been lithographically processed. Wafer 22 has a diffractive optical element 26 thereon. Wafer 24 has a channel 28 etched therein. Any features that can be lithographically created in any manner can be provided on any of the wafers. For example, if the wafers are of different materials, a diffractive optical element could be sandwiched between them. Refractive elements may also be formed, including on adjacent surfaces.

Thus, by using thinner wafers as building blocks, any desired thickness may be realized without altering the fabrication equipment. The wafer bonding device is the only piece of assembly equipment needed to be modified to operate on thick wafers. Thus, the creation of the thick wafers involves a trade-off between the cost of the modification, mainly the operational costs of the fixturing changes, and any additional bonding requirements that are driven by the need for increased thickness.

Whether a thick wafer is a composite wafer or a unitary wafer, the increased aspect ratio of a resultant individual optical subsystems renders the vertical separation of thick wafers more difficult. Conventional separating techniques, such as dicing, are typically limited to wafers having thicknesses of 2 mm or less. So once the thick wafers are formed, some problems arise with conventional separation into the individual optical subsystems. For example, the increased depth increases the total resistance encountered by a separating tool. When dicing, water or other appropriate coolant is used to cool the dicing blade. As the needed cut becomes deeper, it is more difficult for the water to remove the heat generated. This thermal load may lead to cracking of the wafer, particularly for wafers made of material having a relatively low thermal conductivity, e.g., glass. Further, the increased depth of the dicing wears out the blade much faster, requiring a thicker and/or a stronger blade. The blade may still start to bend through the dice. Additionally, when a composite wafer is made from wafers of different materials, the load on the blade may change and/or a different blade may be required.

Figure 3A:
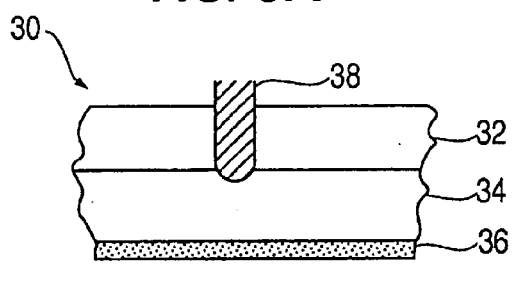
FIGS. 3A and 3B are schematic cross-sectional views of the separating of a two wafer thick structure.
Figure 3B:
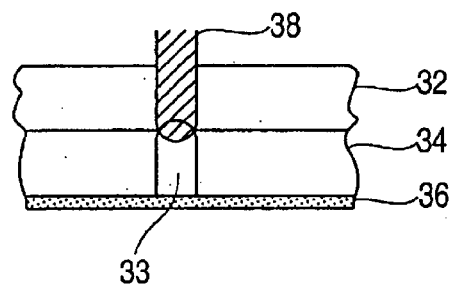

In view of the above problems, an example of thick composite wafer dicing in accordance with the present invention is shown in FIGS. 3A–3B. A thick wafer 30 made up of wafers 32, 34 bonded together is provided on a dice support 36, e.g., dicing tape. When the thick wafer is a composite wafer, typically a conventional dicing blade 38 dices through wafer 32. Since the thickness of the individual wafers is known and the reference position is the dicing tape, this control can be easily realized in a conventional manner. The thick wafer 30 is then removed from the dice support 36, turned over and placed back on dice support 36 with wafer 32 now being in contact with the dicing tape 36. The dicing blade 38 dices through wafer 34 to complete the vertical separation of the thick wafer 30. As noted above, a different dicing blade may be used in accordance with the respective materials of the wafers 32, 34.

If the second dicing pass is for a wafer that is optically transparent, the sidewalls of the first indent 33 may be used to align the dicing blade 38 for the second dicing pass. Alternatively, or in addition to, alignment features, such as marks formed on the wafer level and provided on both surfaces of the thick wafer, may be used to provide the alignment of the dicing blade 38.

Figure 4A:
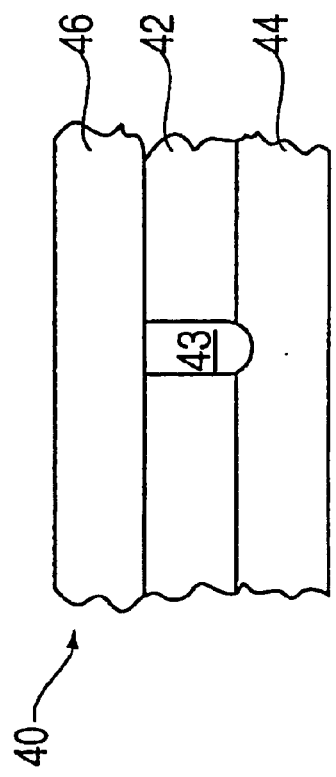
FIGS. 4A–4D are schematic cross-sectional views of the separating of a three wafer thick structure.
Figure 4B:
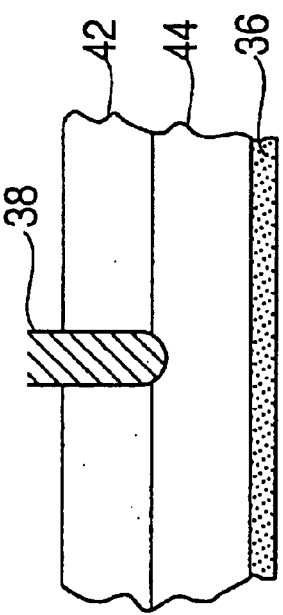
Figure 4C:
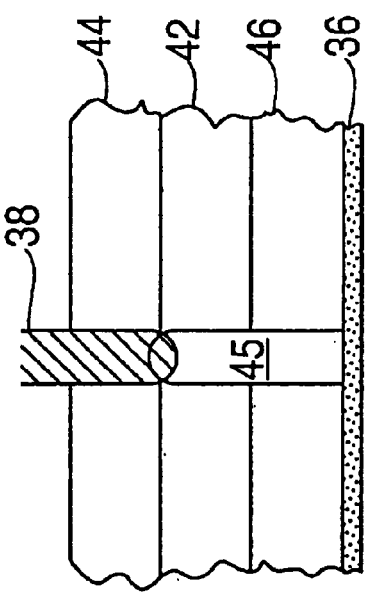
Figure 4D:
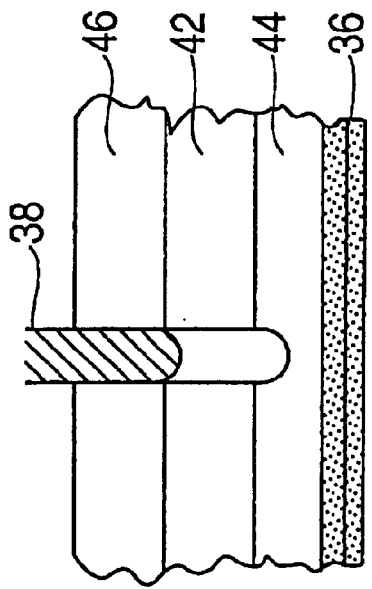

If an even thicker wafer is desired or if the wafer consists of multiple different materials requiring different dicing blades, more than two dicing passes may be used, as shown in FIGS. 4A–4D. In FIG. 4A, bonded wafers 42, 44 are provided on a dicing tape 36. A conventional dicing blade 38 dices through wafer 42. Then, another wafer 46 is bonded to the wafers 42, 44, with the indent 43 there between, to form a thick composite wafer 40. This thick wafer 40 is then placed back on dice support 36 and the dicing blade 38 then dices through the wafer 46, to form a second indent 45. The thick wafer 40 is then removed from the dice support 36, turned over and placed back on dice support 36 with wafer 46 now being in contact with the dice support 36. The dicing blade 38 dices through wafer 44 to complete the vertical separation of the thick wafer 40. It these wafers are transparent, the sidewalls of the first and second indents 43, 45 may be used to align the dicing blade 38 for the second and third dicing passes. As noted above, a different dicing blade may be used in accordance with the respective materials of the wafers 42, 44, 46. These blades may be of different lengths, different widths and/or different materials.

For dicing thick monolithic wafers, the depth of the dice maybe determined in accordance with the type of dicing blade being used and the material of the wafer. There still are at least two dicing passes, with the thick wafer being flipped between. At least two of the passes. Thus by performing more than one dicing pass, multiple optical subsystems of any desired thickness can be created on a wafer level.

Although preferred embodiments of the present invention have been described in detail herein above, it should be clearly understood that many variations and/or modifications of the basic inventive concepts taught herein, which may appear to those skilled in the art, will still fall within the spirit and scope of the present invention as defined in the appended claims and their equivalents. For example, a composite wafer may be formed to allow processing of very thin wafers that could not typically withstand stress of processing and then debonding the composite wafer after processing.

What is claimed is:

1. A method of vertically separating a thick wafer having a top surface and a bottom surface, the thick wafer being on a dice support, the method comprising:

aligning a first dicing tool for a first dice with the thick wafer adjacent to the top surface;

dicing the thick wafer to create a first dice;

flipping the thick wafer so that the top surface is in contact with the dice support;

aligning a second dicing tool for a second dice with the composite wafer adjacent to the bottom surface of the thick wafer; and dicing through the thick wafer.

2. The method of claim 1, wherein the first and second dicing tools are the same.

3. The method of claim 1, further comprising, after said dicing to create the first dice, securing another wafer on top of the first dice.

4. The method of claim 3, further comprising, after dicing to create the first dice, aligning a third dicing tool for a third dice with the thick wafer adjacent to the another wafer and dicing to create a third dice.

5. The method of claim 4, wherein the third dice is created before the second dice.

6. The method of claim 4, wherein at least two of the first, second and third dicing tools are the same.

7. The method of claim 4, further comprising, before said aligning of the first dicing tool, securing the first and second wafers together.

8. The method of claim 7, wherein said securing includes providing adhesive material between the first and second wafers.

9. The method of claim 7, wherein said securing includes fusing the first and second wafers together.

10. The method of claim 7, further comprising, before said securing, lithographically processing at least one of the first and second wafers.

11. The method of claim 10, wherein said lithographically processing includes creating an optical element.

12. The method of claim 1, wherein the thick wafer includes a first wafer and a second wafer.

13. The method of claim 12, wherein the thick wafer includes a first wafer and a second wafer have different thicknesses.

14. The method of claim 12, wherein the first wafer and the second wafer are of different materials.

15. The method of claim 12, wherein at least one of the first and second wafers is lithographically processed on a wafer level.

16. The method of claim 15, wherein at least one of the first and second wafers has a lithographically created optical element thereon.

17. The method of claim 1, wherein said aligning includes aligning the second dicing tool through the thick wafer to the first dice.

18. The method of claim 1, wherein said aligning includes aligning the second dicing tool to alignment marks on the thick wafer.

19. The method of claim 18, further comprising, prior to said aligning of the first dicing tool, creating alignment marks on the top and bottom surfaces of the thick wafer.

20. The method of claim 1, wherein said dicing through the thick wafer realized the vertical separating of the thick wafer.

* * * * *